United States Patent
Familiant et al.

(10) Patent No.: US 9,608,440 B2
(45) Date of Patent: Mar. 28, 2017

(54) METHODS AND APPARATUS FOR DETERMINING POWER DISTRIBUTION SYSTEM TOPOLOGY USING DISTURBANCE DETECTION

(75) Inventors: Yakov Lvovich Familiant, Brown Deer, NC (US); Luis Rafael Pereira, Menomonee Falls, WI (US); Huaqiang Li, Monomonee Falls, WI (US); Michael John Harrison, Petaluma, CA (US)

(73) Assignee: Eaton Corporation, Cleveland, OH (US)

( * ) Notice: Subject to any disclaimer, the term of this patent is extended or adjusted under 35 U.S.C. 154(b) by 1175 days.

(21) Appl. No.: 13/291,642

(22) Filed: Nov. 8, 2011

(65) Prior Publication Data

US 2013/0116946 A1    May 9, 2013

(51) Int. Cl.
*G01R 31/00* (2006.01)
*H02J 3/00* (2006.01)
(Continued)

(52) U.S. Cl.
CPC ............ *H02J 3/00* (2013.01); *G01R 19/2513* (2013.01); *G01R 31/086* (2013.01); *H02J 9/062* (2013.01);
(Continued)

(58) Field of Classification Search
USPC .......................................................... 702/58
See application file for complete search history.

(56) References Cited

U.S. PATENT DOCUMENTS

| 4,251,736 A | * | 2/1981 | Coleman | 307/46 |
| 4,661,769 A | * | 4/1987 | Girgis | 324/76.74 |

(Continued)

FOREIGN PATENT DOCUMENTS

| CN | 1926744 | 3/2007 |
| CN | 101111981 A | 1/2008 |

(Continued)

OTHER PUBLICATIONS

Yacine Hasseaine et al., "Identification of the Topology of Power System Networks Based on Past History and Mixed Integer Inequalities", Power Tech, IEEE Russia, Jun. 27, 2005 pp. 1-6.
(Continued)

*Primary Examiner* — Paul D Lee
(74) *Attorney, Agent, or Firm* — Ward and Smith, P.A.

(57) ABSTRACT

A disturbance, for example, a frequency variation, is generated in at least a portion of the power distribution network. The disturbance may be generated, for example, by an uninterruptible power supply (UPS) or some other component of the power distribution network, such as a switch. At least one node of the network experiencing the disturbance is identified and a topology of the power distribution network is determined responsive to identifying the at least one node. The at least one node may be identified by detecting a voltage-related artifact corresponding to the disturbance. A phase-locked loop (PLL)—based circuit may be used for fast artifact detection. Groups of devices in the network may be identified from the artifacts, and combinatorial optimization techniques may be used to determine connectivity within such groups.

18 Claims, 7 Drawing Sheets

(51) Int. Cl.
*G01R 19/25* (2006.01)
*G01R 31/08* (2006.01)
*H02J 9/06* (2006.01)

(52) U.S. Cl.
CPC ......... *H02J 2003/007* (2013.01); *Y02E 60/76* (2013.01); *Y04S 40/22* (2013.01)

(56) References Cited

U.S. PATENT DOCUMENTS

| | | | |
|---|---|---|---|
| 5,568,399 A * | 10/1996 | Sumic | 700/293 |
| 2003/0165036 A1 * | 9/2003 | Tuladhar | 361/62 |
| 2003/0222507 A1 | 12/2003 | Deng | |
| 2004/0164617 A1 * | 8/2004 | Bobb | H02J 9/062 307/64 |
| 2005/0012395 A1 * | 1/2005 | Eckroad et al. | 307/44 |
| 2005/0065867 A1 * | 3/2005 | Aisu et al. | 705/37 |
| 2005/0195090 A1 | 9/2005 | Finan et al. | |
| 2008/0215302 A1 * | 9/2008 | Nasle et al. | 703/13 |
| 2009/0319093 A1 | 12/2009 | Joos et al. | |
| 2012/0029720 A1 * | 2/2012 | Cherian et al. | 700/297 |

FOREIGN PATENT DOCUMENTS

| | | |
|---|---|---|
| WO | WO 2008/006116 | 1/2008 |
| WO | WO 2011/038756 A1 | 4/2011 |

OTHER PUBLICATIONS

Bentley E.C. et al, "Power quality disturbance source identification using self-organising maps", IET Generation, Transmission & Distribution, vol. 4, No. 10, Oct. 1, 2010, pp. 1188-1196.
Invitation to Pay Additional Fees for PCT/US2012/064048 mailed Aug. 30, 2013, 6 pages.
International Search Report and Written Opinion for PCT/US2012/064048 mailed Nov. 6, 2013, 16 pages.
U.S. Appl. No. 12/814,149 Entitled Automatic Matching of Sources to Loads, filed Jun. 11, 2010 (43 pages).
Bentley et al. "Power quality disturbance source identification using self-organising maps", IET Gener. Transm. Distrib., 2010, vol. 4, Issue 10, pp. 1188-1196.
Chinese Office Action and Search Report Corresponding to Chinese Application No. 201280054635.9; Date of Issuance: Feb. 22, 2016; Foreign Text, 18 Pages, English Translation Thereof, 15 Pages.
Hassaine et al. "Identification of the Topology of Power System Networks Based on Past History and Mixed Integer Inequalities", 2005 IEEE Russia Power Tech, Jun. 27-30, 2005, 6 Pages.

* cited by examiner

METHODS AND APPARATUS FOR DETERMINING POWER DISTRIBUTION SYSTEM TOPOLOGY USING DISTURBANCE DETECTION

BACKGROUND

The inventive subject matter relates to power distribution systems and methods and, more particularly, to systems and methods for monitoring and/or controlling power distribution systems.

The advent of the internet and new developments in computer technology have led to a rapid increase in the number and complexity of data centers. For example, some internet applications, such as e-commerce and cloud computing, are now served by very large data centers housing rows of equipment racks full of servers, disk drive arrays, routers, switches and other computer and communications devices. The equipment in a data center may be distributed across hundreds of thousands of square feet of building space and may span multiple floors and/or buildings.

Such large-scale data centers may have very elaborate and dynamic power distribution systems. For example, a typical large scale data center may include multiple inputs for utility power, along with one or more diesel- or gas-powered generators configured to back up the utility sources via automatic transfer switches (ATSs) and similar devices. Power from these various sources may be distributed via an extensive network of power panels, power distribution units (PDUs) and other devices, along with an array of power lines that interconnect such devices. Backup power for the network may be provided by an array of uninterruptible power supplies (UPSs) that provide backup power from batteries or other energy storage devices, such as fuel cells or flywheel energy storage devices. Some data centers also are configured to receive power directly from alternative energy sources, such as wind-powered generators or photovoltaic arrays.

Data centers typically have a modular or semi-modular architecture including multiple racks that house servers, routers and similar devices. This equipment may be frequently interchanged, replaced and otherwise reconfigured as the data center grows and/or tasks performed by the data center change. Maintenance and other operations may also lead to reconfiguration of the data center. Growth and rearrangement often results in reconfiguration of the data center power distribution network as, for example, certain server racks are moved from one power source to another. For purposes such as planning, maintenance and load balancing, it is generally desirable to have up-to-date information on the configuration of the power distribution network.

U.S. patent application Ser. No. 12/814,149, filed Jun. 11, 2010, describes techniques for matching sources of electric power with computing resources. These techniques generally involve correlating source activity data, such as current, power consumption, harmonic distortion and the like, with load activity data, such as CPU utilization, I/O utilization, network utilization and the like.

SUMMARY

Some embodiments of the inventive subject matter provide methods of operating a power distribution network. An component of the power distribution network, such as an uninterruptible power supply (UPS), is operated to generate a disturbance in at least a portion of the power distribution network. At least one node of the network experiencing the disturbance is identified and a topology of the power distribution network is determined responsive to identifying the at least one node.

In some embodiments, an inverter of a UPS may be operated to generate the disturbance. For example, operating an inverter of the UPS to generate the disturbance may include varying an output frequency and/or a voltage amplitude. In further embodiments, operating a UPS to generate a disturbance in at least a portion of the power distribution network may include transitioning the UPS between a utility-powered mode and an inverter-powered mode to generate the disturbance.

Identifying at least one node of the network experiencing the disturbance may include receiving a communication from at least one device of the power distribution network. Identifying at least one node of the network experiencing the disturbance may include detecting the disturbance using a detection circuit of a device coupled to the at least one node.

In some embodiments, identifying at least one node of the network experiencing the disturbance may include obtaining voltage values representing voltage at the at least one node, generating angle estimates from the voltage values and detecting an artifact from the angle estimates. Detecting an artifact from the angle estimates may include detecting a variation in a rate of change of the angle estimates.

According to further embodiments, determining a topology of the power distribution network responsive to identifying the at least one node may include determining a connectivity of a device associated with the identified at least one node. Determining a topology of the power distribution network responsive to identifying the at least one node may include identifying a group of devices associated with the disturbance responsive to identification of the at least one node and performing a combinatorial optimization to determine a connectivity among members of the group of devices. Performing a combinatorial optimization to determine a connectivity among members of the group of devices may be preceded by receiving power-related information pertaining to the group of devices and performing a combinatorial optimization to determine a connectivity among members of the group of devices may include performing the combinatorial optimization using the received power-related information.

Some embodiments provide methods of monitoring a power distribution network including detecting artifacts at a plurality of nodes of the power distribution network associated with respective component devices of the power distribution network, determining a correlation among the detected artifacts to identify at least one group of the devices of the power distribution network and determining a topology of the power distribution network responsive to the identification of the at least one group. Detecting artifacts may include generating angle values from voltage values and detecting a variation in a rate of change of the angle values. Determining a correlation among the detected artifacts to identify at least one group of the devices of the power distribution network may include detecting a correspondence between the detected artifacts and a disturbance introduced into the power distribution network.

The methods may further include operating a component (e.g., a UPS) of the power distribution network to generate the disturbance. Operating a component of the power distribution network to generate the disturbance may include, for example, changing between a utility-powered mode and an inverter-powered mode of a UPS to generate the disturbance. Operating a component of the power distribution network to generate the disturbance may include operating an inverter to vary a frequency and/or magnitude of an output voltage.

According to further aspects, determining a topology of the power distribution network responsive to the identification of the at least one group may include performing a combinatorial optimization to determine a connectivity among members of the at least one group of devices. Performing a combinatorial optimization to determine a connectivity among members of the at least one group of devices may include performing the combinatorial optimization using power-related information pertaining to the devices of the at least one group.

Additional embodiments provide an apparatus including a communications circuit configured to receive information relating to artifacts from a plurality of devices associated with a power distribution network and a topology determiner circuit configured to determine a correlation among the artifacts to identify at least one group of the devices of the power distribution network and to determine a topology of the power distribution network responsive to the identification of the at least one group. The topology determiner circuit may be configured to cause a component (e.g., a UPS) of the power distribution network to introduce a disturbance in the power distribution network and to determine a correlation of the artifacts with the introduced disturbance to identify a group of devices.

The apparatus may further include respective artifact detector circuits included in respective ones of the plurality of devices. At least one of the artifact detector circuits may be configured to generate angle estimates responsive to a voltage at a node associated with a device of the power distribution network. The artifact detector circuit may be further configured to detect a deviation in a rate of change of the angle estimates and to communicate information relating the detected deviation to the topology determiner circuit.

In some embodiments, the topology determiner circuit may be configured to perform a combinatorial optimization to determine a connectivity among members of the at least one group of devices. The topology determiner circuit may be configured to perform the combinatorial optimization using power-related information pertaining to the devices of the at least one group.

Still further embodiments provide a system including a plurality of sensors, each configured to detect a voltage at a node of a power distribution network, to generate angle estimates responsive to the detected voltage and to detect an artifact responsive to the angle estimates. The system further includes a supervisory device configured to receive information pertaining to the detected artifacts and to determine a correlation among the artifacts to identify at least one group of devices of the power distribution network and to determine a topology of the power distribution network responsive to the identification of the at least one group.

The sensors may be configured to detect the artifacts responsive to a variation in a rate of change of the angle estimates. The sensors may each comprise a phase-locked loop circuit configured to generate the angle estimates.

The supervisory device may be configured to perform a combinatorial optimization to determine a connectivity among members of the at least one group of devices. The supervisory device may be further configured to cause a component device, such as a UPS, of the power distribution network to introduce a disturbance in the power distribution network and to determine a correlation among the artifacts and the disturbance to identify the at least one group of devices.

DETAILED DESCRIPTION OF EXEMPLARY EMBODIMENTS

Specific exemplary embodiments of the inventive subject matter now will be described with reference to the accompanying drawings. This inventive subject matter may, however, be embodied in many different forms and should not be construed as limited to the embodiments set forth herein; rather, these embodiments are provided so that this disclosure will be thorough and complete, and will fully convey the scope of the inventive subject matter to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive subject matter. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive subject matter belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein.

Generally, embodiments of the inventive subject matter may be embodied as methods, apparatus and/or computer readable media. Exemplary embodiments are described herein with reference to block diagrams and/or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit such as a digital processor, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s). These computer program instructions may also be stored in a computer-readable medium that can direct a computer or other programmable data processing apparatus to function in a particular manner, such that the instructions stored in the computer-readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD-ROM), and a portable digital video disc read-only memory (DVD/Blu-eRay).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks.

Accordingly, embodiments of the present invention may be embodied in hardware and/or in software (including firmware, resident software, micro-code, etc.) that runs on a processor such as a digital signal processor, which may collectively be referred to as "circuitry," "a module" or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added and/or inserted between the blocks that are illustrated. Moreover, although some of the diagrams include arrows on communication paths to show a primary direction of communication, it is to be understood that communication may occur in the opposite direction to the depicted arrows.

Some embodiments of the inventive subject matter arise from a realization that topology of a power distribution network may be determined by tracing frequency changes or other disturbances introduced by a network component, such as a UPS or transfer switch. An assignment process may be used to determine interconnections in the network using additional inputs, such as measured power, frequency or derivative quantities. For example, a component, such as a UPS, of a power distribution network may be used to generate a momentary frequency and/or amplitude disturbance on the power distribution network. Voltage waveform artifacts associated with the disturbance may be detected at power distribution system components downstream of the subject UPS. Correlation of these artifacts with the generated disturbance may be used to identify a group of devices. A combinatorial optimization algorithm may be used to map relative interconnections among the group components using parameters such as measured power or frequency. According to further embodiments, a PLL-based technique for rapid detection of voltage disturbances may be employed such that relatively minor disturbances may be used for the topology determination process, thus reducing or eliminating disruption of computing processes.

Figure 1:
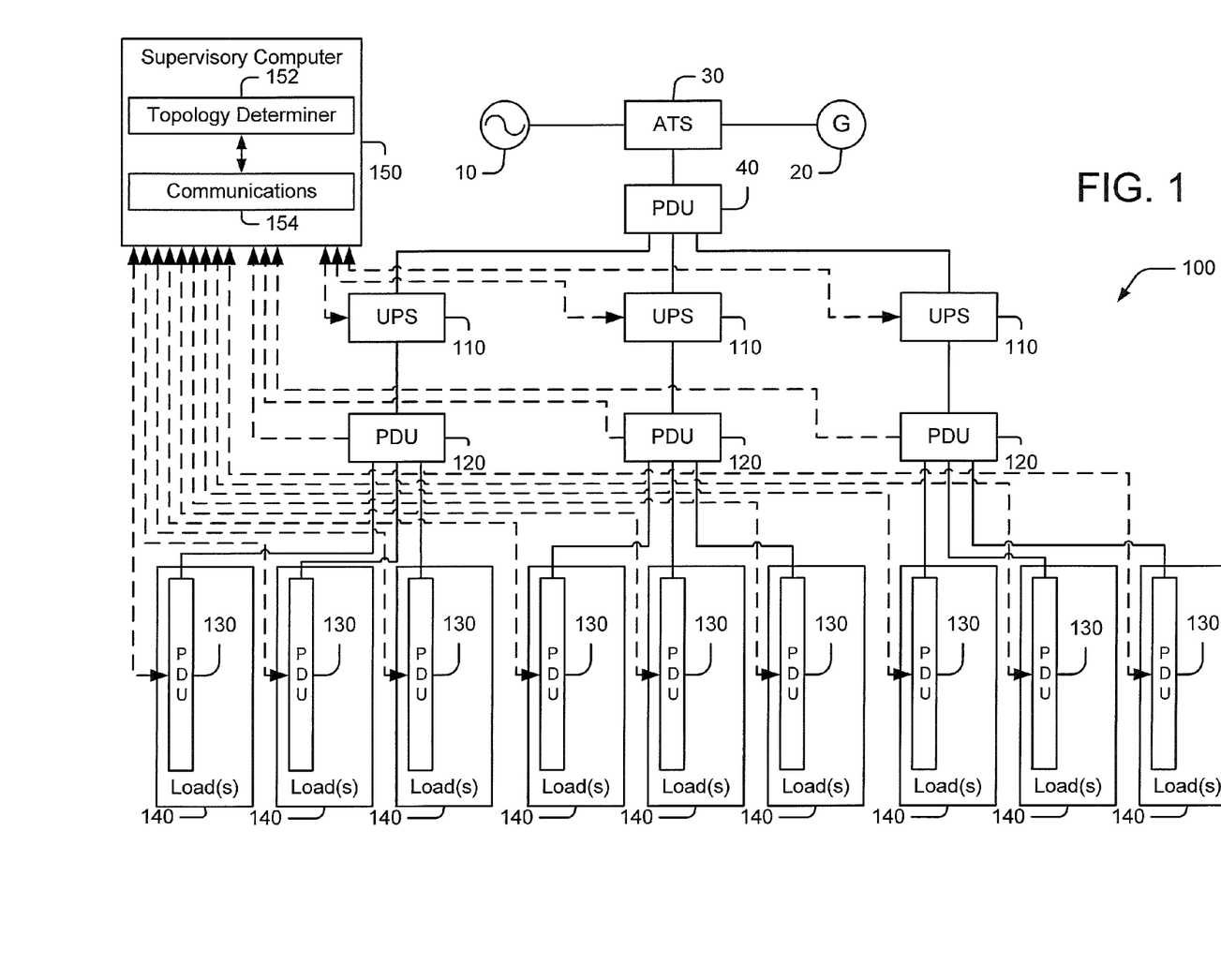
FIG. 1 is a schematic diagram illustrating a power distribution system and apparatus and operations for determining a topology thereof according to some embodiments of the inventive subject matter.

FIG. 1 illustrates a power distribution system 100 according to some embodiments of the inventive subject matter. The power distribution system 100 includes a plurality of UPSs 110, which receive power from a utility source 10 and a generator 10 via an ATS 20 and PDU 40. Downstream from the UPSs 110, first PDUs 120 distribute power to multiple downstream PDUs 130 that each serve one or more loads. For example, the PDUs 120 may be large, floor- or wall-mounted units or panels that provide branch circuits, and the downstream PDUs may include, for example, power-strip-like units that are mounted in or near electronic equipment racks (e.g., 19-inch racks) that house servers, routers and/or other data processing equipment. It will be appreciated that the network components illustrated are provided for purposes of illustration, and that a wide variety of other types of power distribution network components may be present.

It will also be understood that FIG. 1 illustrates a possible configuration of the power distribution system 100, e.g., a "snapshot" of a particular connectivity at a particular moment in time, and that, generally, the connectivity of the power distribution system 100 may change over time as the data center grows and/or is reconfigured. For example, through changes in connections of various ones of the PDUs 130 to the upstream PDUs 120, the connectivity of the power distribution system 100 may be changed. Maintenance operations on particular ones of the UPSs 110 that take those UPSs offline may also necessitate changes in interconnection of remaining in-service UPSs 110 to the various PDUs 120, 130. These changes may be implemented using, for example, manual changes of interconnecting cables and/or by switchgear (not shown) that supports reconfiguration of the power distribution network 100.

As further illustrated, a supervisory computer 150, which may constitute one or more physical devices, is linked to the UPSs 110 and the PDUs 120, 130 by communications links. These communications links are shown in FIG. 1 in dashed line to illustrate logical connections, as it will be appreciated that the UPSs 110 and the PDUs 120, 130 may be linked to the supervisory computer 150 using any of a variety of different physical links including, but not limited to, serial and/or parallel wired communications links (e.g., Ethernet or other standardized wired links), optical links and/or wireless links (e.g., IEEE 802.11 links). The supervisory computer 150 is configured (e.g., by execution of software) to provide a communications circuit 154 that communicates with the UPSs 110 and the PDUs 120, 130. These communications links may be used, for example, to convey various status information, such as voltage levels, current levels, power levels and the like, from the UPSs 110 and the PDUs 120, 130 to the supervisory computer 150, and/or to convey various control commands from the supervisory computer 150 to the UPSs 110 and PDUs 120, 130. As further shown, the supervisory computer 150 may also be configured to provide a topology determiner circuit 152 that is used to determine a topology of the power distribution network 100 based on information communicated between the supervisory computer 150 and the UPSs 110 and PDUs 120, 130.

Figure 2:
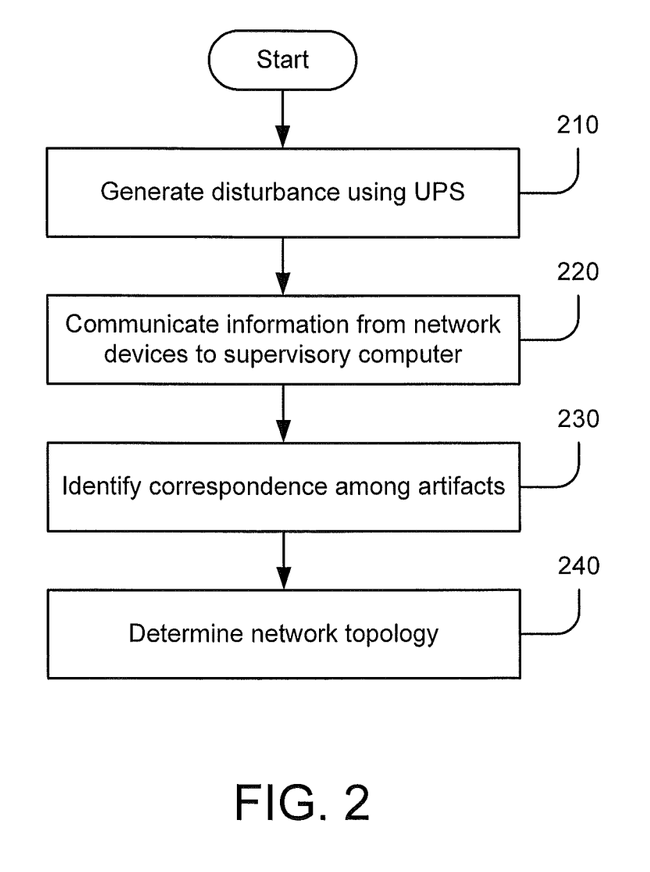
FIG. 2 is a flowchart illustrating operations for determining topology of a power distribution network according to some embodiments of the inventive subject matter.

As illustrated in FIG. 2, for example, a disturbance may be generated on the power distribution network 100 using one of the UPSs 110 (block 210). For example, in some embodiments, an inverter of one of the UPSs 110 may be used to generate a momentary frequency and/or amplitude variation on the power lines connected thereto. In some embodiments, a disturbance may be similarly generated by transitioning one of the UPSs 110 between a utility-powered mode and an inverter-powered mode. Information derived from monitoring of voltage, current and/or other electrical parameters associated with nodes of the power distribution network may be communicated from devices on the network, such as the PDUs 120, 130, to the supervisory computer 150 (block 220). For example, such information may be used to identify artifacts associated with the generated disturbance by, for example, identifying correspondence among the artifacts (block 230). The current topology of the network may be determined from the identified artifacts (block 240). For example, as explained in greater detail below, a group of devices experiencing a particular disturbance may be identified from the artifact information, thus indicating which devices of the power distribution network 100 are connected to the UPS 110 providing the disturbance. Additional information received from the devices, such as the power-related electrical parameter (e.g., voltage and/or current) information discussed above, may then be used to determine interconnections among the group members using, for example, combinatorial optimization techniques.

It will be appreciated that the above-described operations are examples provided for purposes of illustration, and that variations thereof fall within the inventive subject matter. For example, although the above describes introducing a disturbance in a power distribution network using a UPS, other devices may be similarly used. For example, inverters that are used to interface fuel cells, photovoltaic arrays or similar devices may be used to generate disturbances along the lines described above.

Figure 3:
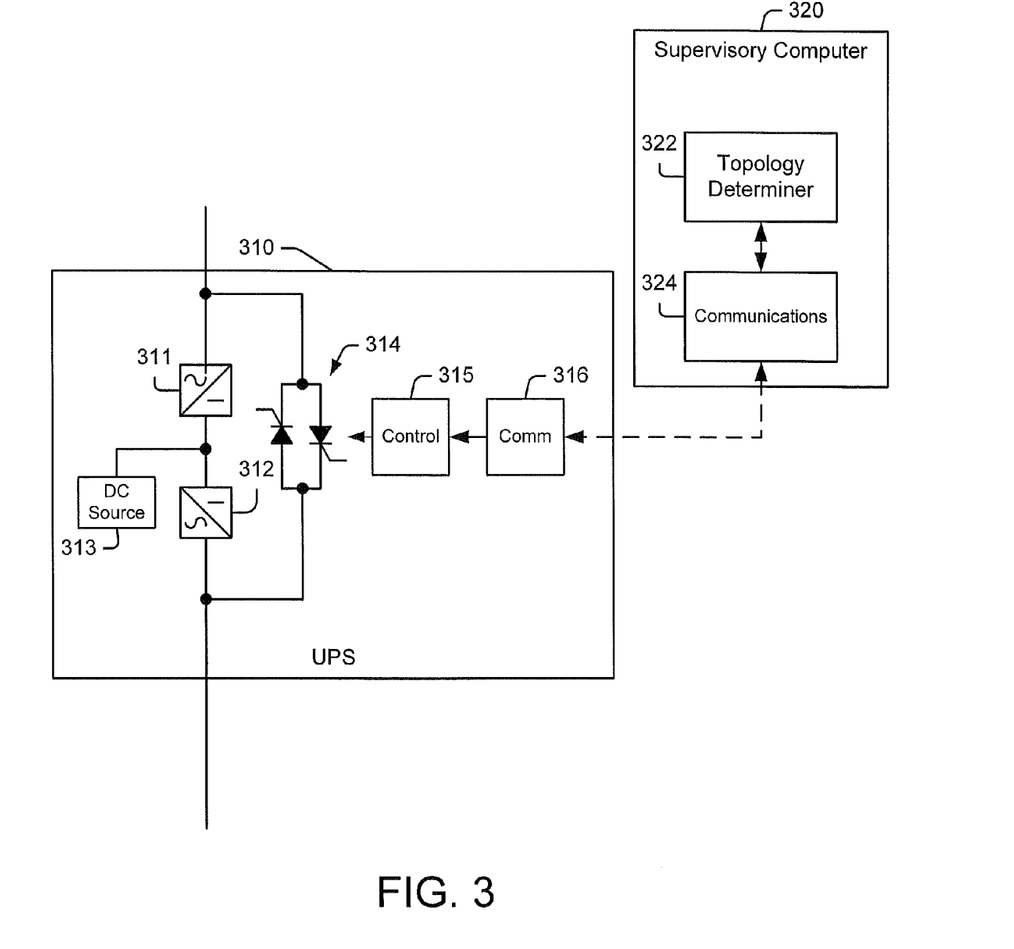
FIG. 3 is a schematic diagram illustrating apparatus and operations for introducing a disturbance in a power distribution network according to some embodiments of the inventive subject matter.

FIG. 3 illustrates an example of a UPS 310, showing how such a device may be used to generate a disturbance for purposes of determining network topology. The UPS 310 is an "on-line" configuration, including a rectifier circuit 311 and an inverter circuit 312 coupled by an intermediate DC bus. A DC source 313, e.g., a battery, fuel cell, flywheel storage device or the like, is also coupled to the DC bus, and provides backup power to the inverter circuit 312 in the event of the failure of a primary power source, such as a utility or generator source, coupled to the rectifier circuit 311. A static switch bypass circuit 314 may be used to bypass the rectifier/inverter chain. The bypass switch 314 may be used, for example, to direct utility/generator power to the load in the event of a failure of the rectifier circuit 311 and/or the inverter circuit 312. The bypass switch 314 may also be used to support certain mode of operation, such a "high efficiency" modes in which the rectifier circuit 311 and the inverter circuit 312 are bypassed when the primary input meets certain power quality criteria. In such a mode, the inverter circuit 312 and/or the rectifier circuit 311 may be used for purposes other than bulk power provision, for example, for harmonic suppression and/or reactive power compensation.

The UPS 310 further includes a control circuit 315 that controls the rectifier circuit 311, the inverter circuit 312, the bypass switch 314 and other components of the UPS 310. The control circuit 315 is operatively coupled to a communications circuit 316, which may support communication of status and control information to and from the UPS 310. As shown in FIG. 3, the communications circuit 316 may be coupled to a communications circuit 324 of a supervisory computer 320. This coupling may be implemented in a number of different ways, for example, via wireline communications busses, optical busses or wireless links. The supervisory computer 320 may be configured to provide a topology determiner circuit 322, which may perform topology determinations along the lines discussed above with reference to FIGS. 1 and 2.

In some embodiments, for example, the topology determiner circuit 322 may communicate commands to the UPS 310 to generate a disturbance that may be used for topology detection. For example, the topology determiner circuit 322 may command the UPs 310 to operate its inverter circuit 312 to momentarily vary the output frequency it produces while in an on-line mode (i.e., when power is being delivered via the rectifier/inverter chain) or in a battery-powered mode. In some embodiments, the topology determiner circuit 322 may command the UPs 310 to create a disturbance by transitioning between on-line (inverter-powered) and bypassed modes.

Although use of a UPS 310 having an on-line configuration is described, it will be understood that other types of UPSs may be used in other embodiments. For example, a standby UPS operating in a battery-powered mode may be similarly used to generate a disturbance.

In other embodiments, instead of commanding the UPS 310 (or a similar device) to generate a disturbance, the topology determiner circuit 322 may receive information from the UPS 310 that is indicative of a disturbance that may be used for topology determination, but was not generated specifically for such a purpose. For example, the topology determiner circuit 322 may detect a transition between on-line and bypassed modes that causes an output voltage disturbance that may be detected at downstream devices. Such an approach may reduce the need to introduce unnecessary and potentially disruptive disturbances into the power distribution system.

Figure 4:
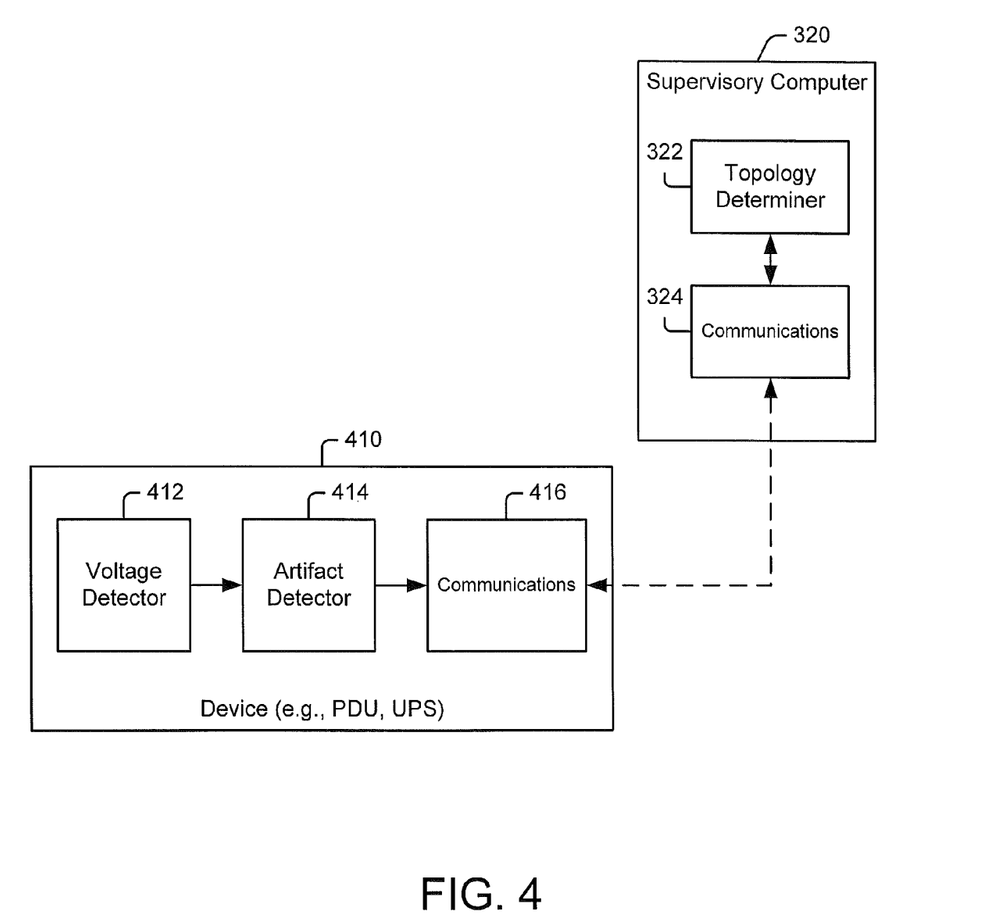
FIG. 4 is a schematic diagram illustrating apparatus and operations for detecting voltage-related artifacts in a power distribution network according to some embodiments of the inventive subject matter.

FIG. 4 illustrates an example of device 410 with the capability of detecting artifacts causally associated with upstream-induced disturbances. The device 410, which may be, for example, a PDU, UPS or other power distribution network component or a monitoring device associated with such a component, includes a voltage detector circuit 412 configured to detect a voltage at a node of the power distribution network. The voltage detector circuit 412 may include, for example, an analog-to-digital converter circuit configured to sample the node voltage and to generate corresponding digital values representative of the sampled voltage. The device 410 further includes an artifact detector circuit 414 that is configured to detect artifacts in the detected voltage. For example, as explained in greater detail below, the artifact detector circuit 414 may include a phase-locked loop (PLL) circuit configured to generate angle estimates from the detected voltage and to detect a variation of a rate of change of the angle estimates, indicative of a voltage frequency change. Other types of detector circuits, such as zero-crossing detector circuits, may also be used. Artifact-identifying information generated by the artifact detector circuit 414 may be communicated to a topology determiner circuit 322 of a supervisory computer 320. This information may be correlated with disturbance information received from other devices, such as from an upstream UPS or PDU, to identify associations among devices. Such associations may be used to determine network topology.

As noted above, in some embodiments, a PLL-based detector that generates angle estimates from input voltages may be used for quick artifact detection. Under normal conditions in an AC power distribution system, angle estimates provided by such a detector would exhibit a substantially constant rate of change, corresponding to the relatively fixed nominal operating frequency (e.g., 60 Hz) of the power distribution system. A disturbance of the AC waveform, however, may cause readily detectable deviation in this rate of change as the frequency of the system varies in response to the disturbance.

Figure 5:
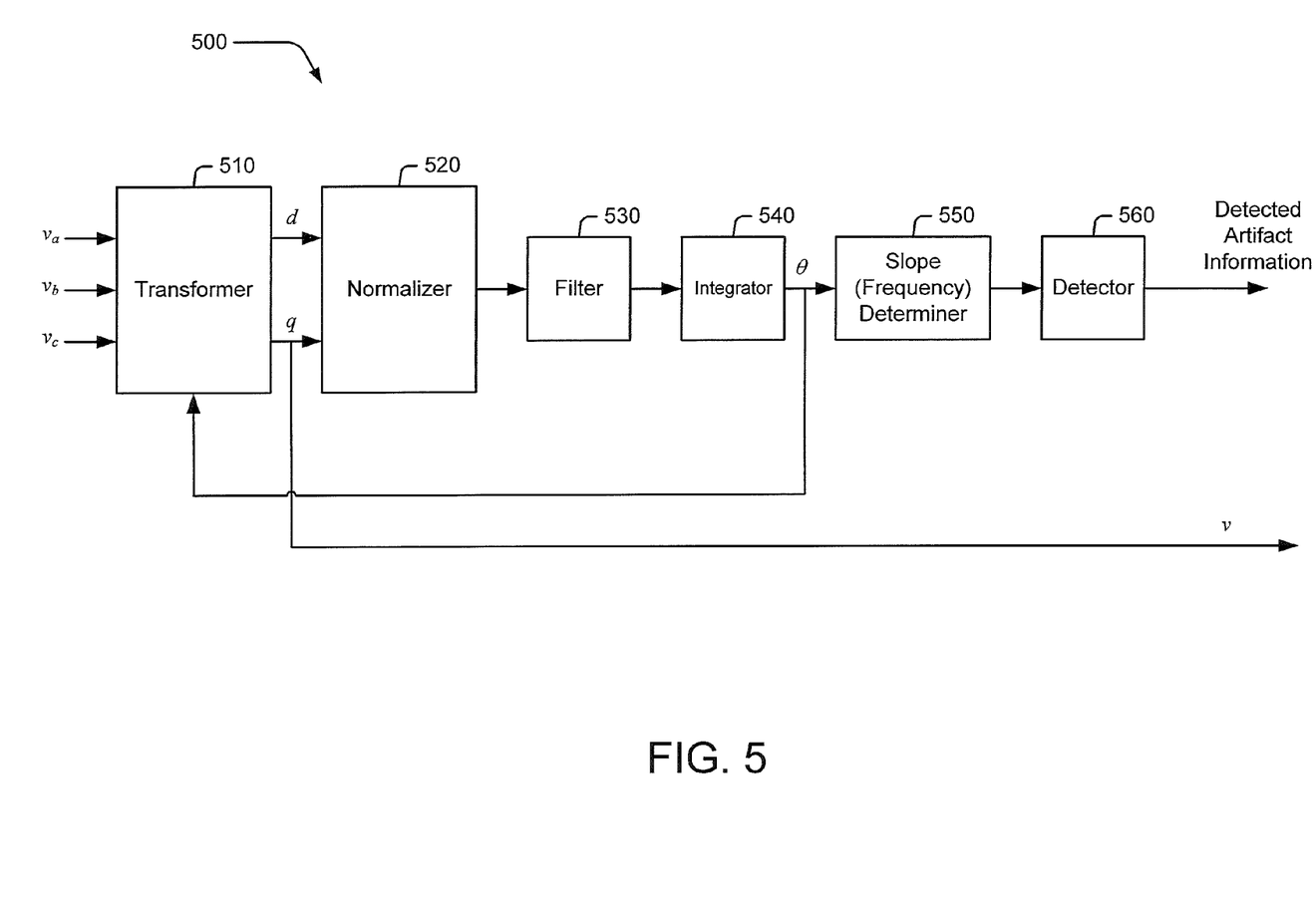
FIG. 5 is a schematic diagram illustrating a PLL-based artifact detector circuit according to some embodiments of the inventive subject matter.

FIG. 5 illustrates a PLL-based detector circuit 500 that may be used for artifact detection in three-phase AC power distribution systems according to some embodiments. The detector circuit 500 includes a d-q transformer circuit 510 that is configured to receive voltage values $v_a$, $v_b$, $v_c$, and to generate corresponding d and q values in a d-q domain. The d values generated by the transformer circuit 520 are normalized in a normalizer circuit 520, and the normalized values produced by the normalizer circuit 530 are processed in a proportional integrator (PI) filter 530. Filtered values produced by the PI filter 530 are integrated by an integrator circuit 540, thus producing angle estimates θ. A slope determiner circuit 550 determines a slope (e.g., rate of change) of the angle estimates θ, corresponding to a frequency of the detected voltage. A detector circuit detects variations in the slope that meet certain criteria indicative of a disturbance that may be associated, for example, with a topology determination process.

Figure 6:
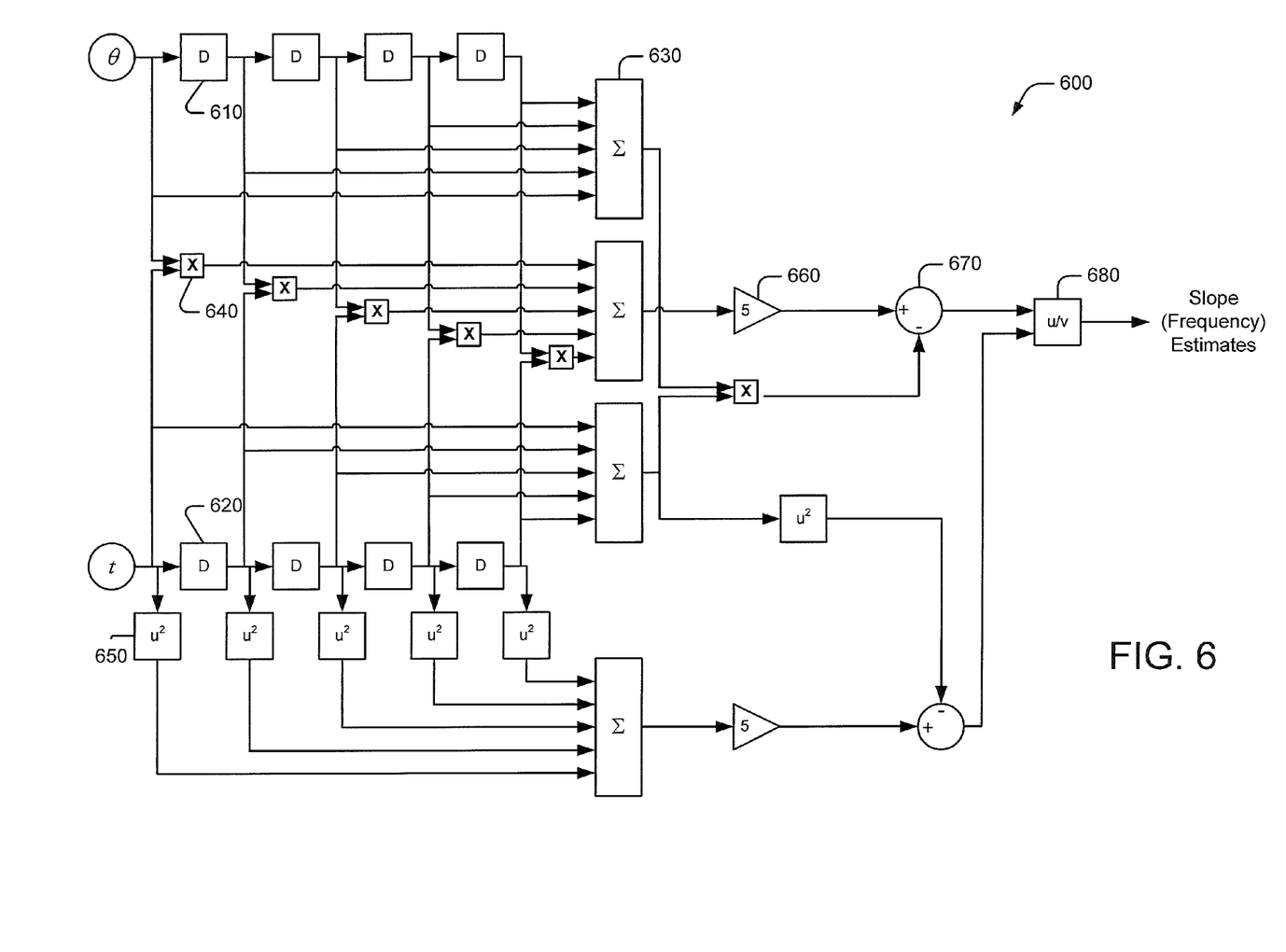
FIG. 6 is a schematic diagram illustrating a slope estimation circuit according to some embodiments of the inventive subject matter.

The slope determiner circuit 550 may employ, for example, a linear regression process to generate slope estimates. A linear regression for calculating slope (frequency) values β may take the form:

$$\beta = \frac{n\sum_{i=1}^{n} x_i y_i - \sum_{i=1}^{n} x_i \sum_{i=1}^{n} y_i}{n\sum_{i=1}^{n} x_i^2 - \left(\sum_{i=1}^{n} x_i\right)^2},$$

wherein $y_i$ represent angle values for respective uniformly-spaced time values $x_i$. Generally, the PLL detector circuit 500 may be implemented using any of a number of different types of circuits, including microprocessor-based circuits. FIG. 6 illustrates an example of a slope determiner circuit 600 that employs a linear regression using a window of 5 time values to generate slope estimates. Angle estimates θ are input to a series of registers 610, which provide for storage of 5 consecutive angle estimates θ. Similarly, a series of registers 620 is used to store a 5 corresponding time values t. Summing circuits 630, multiplier circuits 640, squaring circuits 650, gain circuits 660, subtraction circuits 670 and a divider circuit are used to implement the regression function described above. The circuitry shown in FIG. 6 may be implement using software and/or firmware executing on a microprocessor or other computing devices and/or may be implemented in specialized digital hardware.

Figure 7:
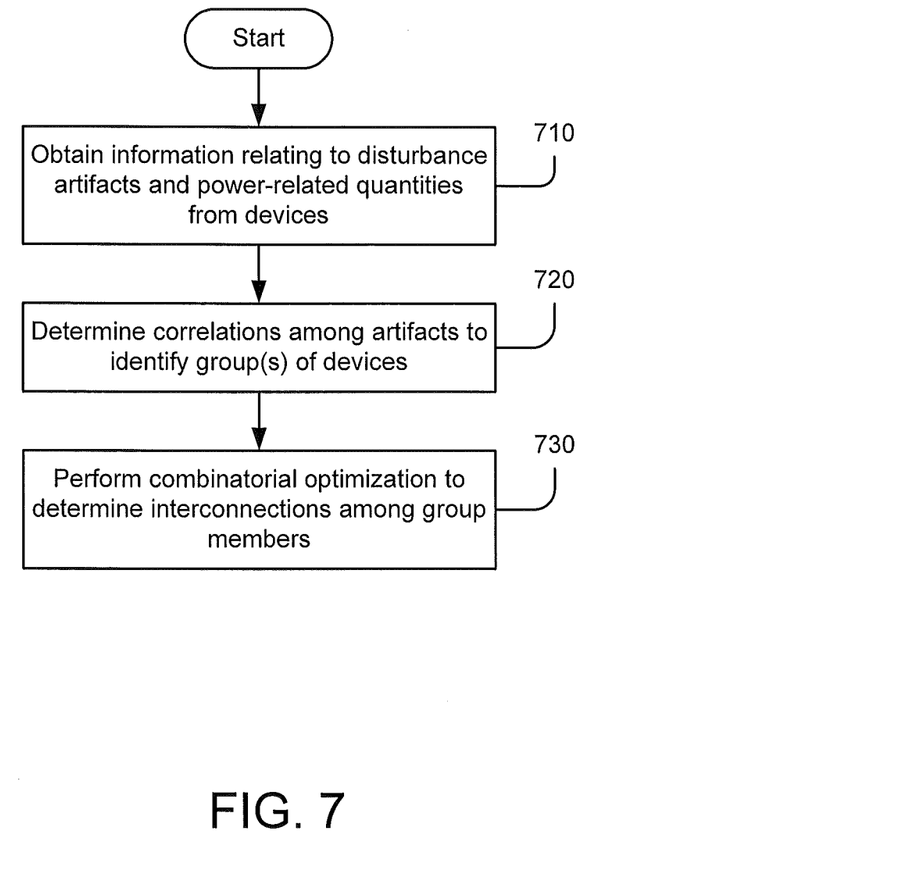
FIG. 7 is a flowchart illustrating operations for determining topology of a power distribution network according to further embodiments of the inventive subject matter.

According to further embodiments of the inventive subject matter, a detailed topological description of a power distribution network may be obtained by using the disturbance detection techniques along the lines discussed above in combination with combinatorial optimization techniques that use other parameters, such as power consumption data, current data and the like. Referring to FIG. 7, for example, information pertaining to disturbance artifacts and power-related quantities may be received from devices associated with a power distribution network (block 710). Correlations among the disturbances may be determined from the artifact information to identify one or more groups of interconnected devices (block 720). A combinatorial optimization may be performed to determine specific interconnections within the one or more groups (block 730). For example, dynamic programming may be used to solve a 0-1 knapsack problem constructed from the power-related information obtained from a given group. Other global or local optimization techniques, for example, various greedy approximation techniques, may also be used. Some embodiments of the inventive subject matter may also use topology determination techniques described herein with other techniques, such as the load/source activity matching techniques described in the aforementioned U.S. patent application Ser. No. 12/814, 149, filed Jun. 11, 2010.

In the drawings and specification, there have been disclosed exemplary embodiments of the inventive subject matter. Although specific terms are employed, they are used in a generic and descriptive sense only and not for purposes of limitation, the scope of the inventive subject matter being defined by the following claims.

That which is claimed:

1. A method of monitoring a power distribution network, the method comprising:
    operating a component of the power distribution network to generate a disturbance;
    detecting artifacts in voltages at a plurality of nodes of the power distribution network associated with respective component devices of the power distribution network;
    determining a correlation of the detected artifacts with the disturbance to identify at least one group of the devices of the power distribution network; and
    determining a topology of the power distribution network responsive to the identification of the at least one group.

2. The method of claim 1, wherein detecting artifacts from the monitored voltages comprises generating angle values from voltage values and detecting a variation in a rate of change of the angle values.

3. The method of claim 1, wherein operating a component of the power distribution network to generate the disturbance comprises changing between a utility-powered mode and an inverter-powered mode of a UPS to generate the disturbance.

4. The method of claim 1, wherein operating a component of the power distribution network to generate the disturbance comprises operating an inverter to vary a frequency and/or magnitude of an output voltage.

5. The method of claim 1, wherein determining a topology of the power distribution network responsive to the identification of the at least one group comprises performing a combinatorial optimization to determine a connectivity among members of the at least one group of devices.

6. The method of claim 5, wherein performing a combinatorial optimization to determine a connectivity among members of the at least one group of devices comprises performing the combinatorial optimization using power-related information pertaining to the devices of the at least one group.

7. A non-transitory computer-readable medium comprising computer program code embodied therein, the computer program code configured to perform the claim 1.

8. An apparatus comprising:
a communications circuit configured to receive information relating to artifacts from a plurality of devices associated with a power distribution network; and
a topology determiner circuit configured to cause a component of the power distribution network to introduce a disturbance in the power distribution network, to determine a correlation of the artifacts with the introduced disturbance to identify at least one group of the devices, and to determine a topology of the power distribution network responsive to the identification of the at least one group.

9. The apparatus of claim 8, further comprising respective artifact detector circuits included in respective ones of the plurality of devices.

10. The apparatus of claim 9, wherein at least one of the artifact detector circuits is configured to generate angle estimates responsive to a voltage at a node associated with a device of the power distribution network.

11. The apparatus of claim 10, wherein the detector circuit is further configured to detect a deviation in a rate of change of the angle estimates and to communicate information relating the detected deviation to the topology determiner circuit.

12. The apparatus of claim 8, wherein the communications circuit is further configured to receive electrical parameter information from the plurality of devices and wherein the topology determiner circuit is configured to perform a combinatorial optimization based on the received electrical parameter information to determine a connectivity among members of the at least one group of devices.

13. The apparatus of claim 12, wherein the topology determiner circuit is configured to perform the combinatorial optimization using power-related information pertaining to the devices of the at least one group.

14. A system comprising:
a plurality of sensors, each configured to detect a voltage at a node of a power distribution network, to generate angle estimates responsive to the detected voltage and to detect an artifact responsive to the angle estimates; and
a supervisory device configured to cause a component of the power distribution network to introduce a disturbance in the power distribution network, to receive information pertaining to the detected artifacts, to determine a correlation among the artifacts and the disturbance to identify at least one group of devices of the power distribution network and to determine a topology of the power distribution network responsive to the identification of the at least one group.

15. The system of claim 14, wherein the sensors are configured to detect the artifacts responsive to a variation in a rate of change of the angle estimates.

16. The system of claim 14, wherein the sensors each comprise a phase-locked loop circuit configured to generate the angle estimates.

17. The system of claim 14, wherein the supervisory device is configured to perform a combinatorial optimization to determine a connectivity among members of the at least one group of devices.

18. The system of claim 14, wherein the component comprises a UPS.

* * * * *

UNITED STATES PATENT AND TRADEMARK OFFICE
CERTIFICATE OF CORRECTION

| | | |
|---|---|---|
| PATENT NO. | : 9,608,440 B2 | Page 1 of 1 |
| APPLICATION NO. | : 13/291642 | |
| DATED | : March 28, 2017 | |
| INVENTOR(S) | : Yakov Lvovich Familiant et al. | |

It is certified that error appears in the above-identified patent and that said Letters Patent is hereby corrected as shown below:

(75) Please change "Yakov Lvovich Familiant, Brown Deer, NC (US)" to:
-- Yakov Lvovich Familiant, Brown Deer, WI (US) --

Column 11, Line 21, please change "to perform the claim 1." to:
-- to perform the method of claim 1. --

Signed and Sealed this
Twelfth Day of September, 2017

Joseph Matal
*Performing the Functions and Duties of the*
*Under Secretary of Commerce for Intellectual Property and*
*Director of the United States Patent and Trademark Office*